United States Patent

Foxhall et al.

[15] 3,638,300

[45] Feb. 1, 1972

[54] FORMING IMPURITY REGIONS IN SEMICONDUCTORS

[72] Inventors: George Frederic Foxhall, Spring Township, Berks County, Pa.; Robert Alan Moline, Gillette, N.J.

[73] Assignee: Bell Telephone Laboratories, Incorporated, Murray Hill, N.J.

[22] Filed: May 21, 1970

[21] Appl. No.: 39,378

[52] U.S. Cl. ..... 29/589, 148/1.5

[51] Int. Cl. ..... B01j 17/00, H01l 7/02

[58] Field of Search ..... 148/1.5; 317/235; 29/576 B, 29/589

[56] References Cited

UNITED STATES PATENTS

| | | | |
|---|---|---|---|
| 3,483,443 | 12/1969 | Mayer et al. | 317/234 |
| 3,558,366 | 1/1971 | Lepselter | 148/1.5 |
| 3,560,809 | 2/1971 | Terakido | 317/234 |
| 3,586,542 | 6/1971 | MacRae | 148/1.5 |

*Primary Examiner*—John F. Campbell
*Assistant Examiner*—W. Tupman
*Attorney*—R. J. Guenther and Arthur J. Torsiglieri

[57] ABSTRACT

The specification describes a technique for fabricating hyperabrupt silicon diodes with unusually sharp C-V characteristics and with a high degree of control. The technique employs an ion bombardment predeposit and a thermal diffusion "drive-in" according to specifically prescribed conditions.

5 Claims, 4 Drawing Figures

$f \propto \frac{1}{\sqrt{C}}$ $C \propto V-2$ $f \propto V$

INVENTORS G. F. FOXHALL
R. A. MOLINE
BY [signature]
ATTORNEY

PATENTED FEB 1 1972 3,638,300

FORMING IMPURITY REGIONS IN SEMICONDUCTORS

This invention relates to a technique for forming hyperabrupt junction diodes.

Recent advances in ion implantation as a method for doping semiconductors are sufficiently encouraging that this technique has been adopted commercially on a limited scale as a substitute for conventional diffusion methods. Many new applications for this technique are presently being considered.

Ion implantation of impurities in semiconductors has been compared in all its essential details with thermal diffusion. The advantages and disadvantages of both techniques are well established. The principal virtue of ion implantation is the precise degree of control over the concentration of impurities in the semiconductor. The ability to achieve unusual impurity profiles can also be important in some cases.

Recently, considerable interest has been generated in hyperabrupt junction diodes, devices which are characterized by a rapid change in the depletion layer capacitance with reverse voltage. The C-V relationship of a typical hyperabrupt diode shows a severe decrease in capacitance with voltage as compared with those of the more familiar linear graded and abrupt step junction diodes.

Several techniques have been sued for fabricating hyperabrupt structures. For example, alloy diffusion in germanium and silicon have been described.

Diffusion techniques are simple in principle but difficult to control in practice. For example, a double diffusion technique has been investigated wherein an antimony layer is diffused into an $n$-type epitaxial slice through windows in the oxide. A boron layer is then diffused to the appropriate depth, forming the PN-junction with appropriate doping density under the junction.

Since the boron is being diffused into a steeply graded antimony layer, and since the concentrations are high enough to affect the diffusion coefficient, it was found that obtaining the appropriate doping profile was difficult. An elaborate method was necessary in which the chips cut from the slice after the boron prediffusion were diffused for various lengths of time. The C–V relationship of each chip was measured, and the proper diffusion time for the remainder of the slice selected.

Even with this attention, a wide dispersion in characteristics was found due to small variations across the slice in the diffused layers. Many of the diodes were not hyperabrupt at all. Some had too much doping on the $n$ side of the junction and a consequent low breakdown voltage. Others had insufficient doping, and behaved like a graded junction. Of those devices which were hyperabrupt, the control on the parameters was poor. Overall yields of less than 1 percent were obtained.

A vastly superior method of fabrication is obtained by the technique of this invention. It employs an ion implantation predeposit with a subsequent thermal treatment to diffuse the atoms to their ultimate sites within the semiconductor. In this case direct control over the doping level in the layer is achieved by counting the charge delivered to the slice by the ion beam. Thus, a profile with, for example, a peak concentration near the surface of $2\times10^{16}$ cm.$^{-3}$ and sheet resistance of 10,000 Ω/□ is easily controlled within a few percent. Such control cannot be obtained using conventional techniques. Also, variations due to changing junction depth can be eliminated by means of a platinum silicide Schottky diode.

These and other aspects of the invention may be more fully understood with the aid of the following detailed description.

The C-V relationship for a hyperabrupt diode can be described by $$(dC/C)=-m(dV/V), \qquad (1)$$

where $C$ is the capacitance, $V$ is the applied voltage, and $m$ is the magnitude of the slope. For the hyperabrupt junction, the slope changes rapidly with voltage but it is useful to denote the maximum value of $m$ as $m^*$, indicated by the tangent at the point of inflection to the log $C$-log $V$ curve. The quantity $m^*$ is a measure of the sensitivity of the diode, and is important to the device user. Also of importance are the quantities $C_m^*$ and $V_m^*$, the capacitance and voltage at the point of inflection.

Figure 1:
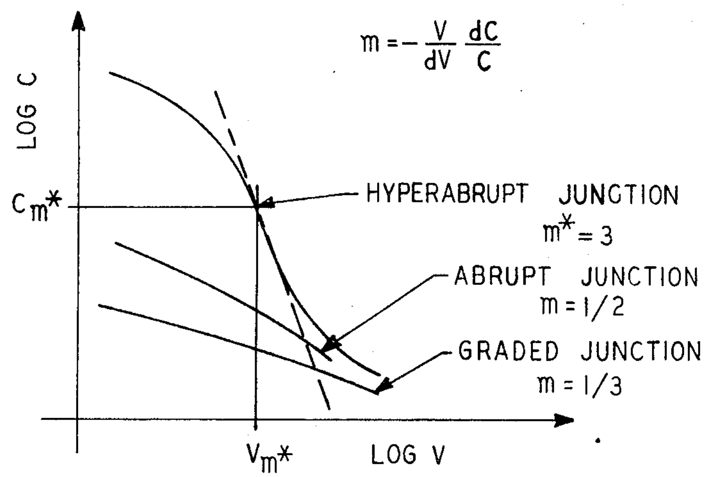
FIG. 1 is a plot of capacitance vs. voltage on a logarithmic scale for three different forms of diodes.
Figure 2:
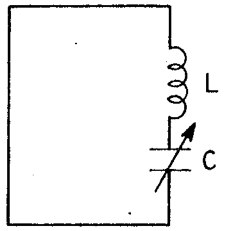
FIG. 2 is a circuit arrangement for utilizing a device fabricated in accordance with the invention.

A simple example of the utility of such a device is illustrated in FIG. 2. For a simple tuned circuit, the frequency of oscillation is proportional to $1/\sqrt{C}$. In a voltage variable capacitor having a $C$-$V$ relation such that $C\alpha\ V^{-2}$, the frequency is linearly dependent on the applied voltage. Thus, it is clear that voltage controlled oscillators can be readily designed using the hyperabrupt diode. Indeed such a device will be incorporated into a commercial FM transmitter, where circuit simplifications will lead to sizeable annual cost savings. This application requires $m^*$ between 2.5 and 4, $C_m^*$ between 7 and 9 pf., and $V_m^*$ between 3 and 5 volts.

Considerable insight as to the physical parameters which control the hyperabrupt characteristics may be gained from $$m=\frac{-d(\log C)}{d(\log V)}=\frac{V}{C}\frac{dC}{DV}=\frac{VC^2}{q\kappa\epsilon_0 N(d)A^2} \qquad (2)$$

and $$V=\frac{q}{\kappa\epsilon_0}\int_0^d\int_{x'}^d N(x)\,dx\,dx'-V_D, \qquad (3)$$

where $x=0$ is taken at the junction and very heavy doping is assumed for $x<0$, the depletion edge is at a depth $d$, $\kappa$ is the dielectric constant, $q$ the magnitude of the electron charge, $\epsilon_0$ the permittivity of free space, and $V_D$ the diffusion voltage of the junction. Equations 2 and 3 can be combined to obtain $$m=\frac{\int_0^d\int_{x'}^d N(x)\,dx\,dx'-V_D}{d^2N(d)} \qquad (4)$$

where $N$ in equation 2 is actually the zero bias electron density. In particular, one notes the interdependence of $m$, $C$, and $V$, and their critical dependence on the nature of the impurity profile.

As seen from equation 4, to achieve the hyperabrupt characteristic, it is necessary to provide an impurity profile which decreases in doping density with the distance from the rectifying junction.

Equation 4 has been used to infer a technique for broadening the range of voltage over which $m$ is near its maximum value, $m^*$. This has been achieved by increasing the doping density at an appropriate depth to reduce $m^{=}$, leaving values of $m$ at adjacent voltages nearly unchanged. Computer solutions for specific types of distributions are also useful in predicting parameter values.

The technique of the invention was applied to the fabrication of silicon hyperabrupt diodes by first exposing the silicon substrate to a predeposit of phosphorous ions at approximately 50 kev. The silicon substrate had an initial bulk impurity level of approximately $10^{14}$ atoms cm.$^{-3}$. The total flux was $7.5\times10^{11}$ ions/cm.$^2$.

This predeposit places the bulk of the impurities in a surface layer of the order of 500 to 1,000 A. in thickness.

Figure 3:
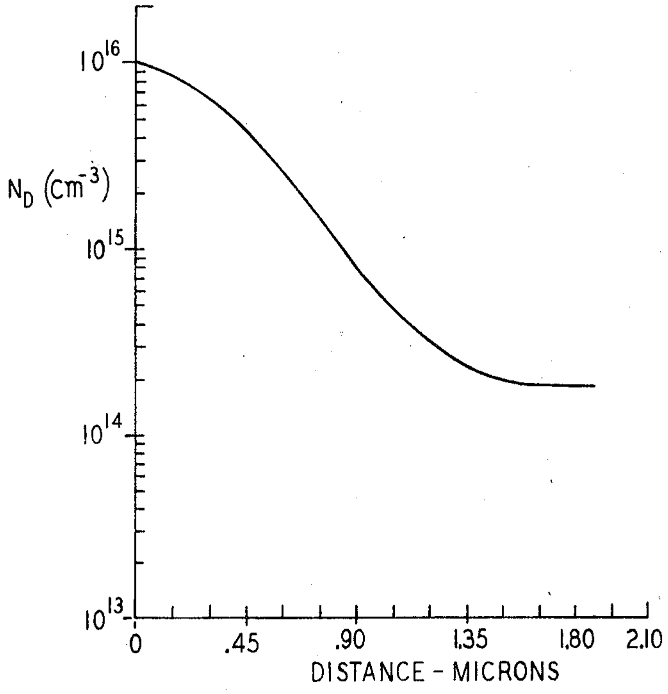
FIG. 3 is an impurity profile (impurities $N_D$, vs. distance) obtained by following the teachings of the invention.

The substrate was then heated in oxygen for 60 minutes at 1,100° C. to further diffuse the impurities. The final impurity profile is shown in FIG. 3. The diffusion in this case extends to 1.5 microns and the profile is very uniform.

Diffusing the predeposited silicon in an oxygen ambient was found to be very effective from the standpoint of control. Under these conditions the silicon surface quickly oxidizes and the oxide will grow to a depth of approximately 1,500 angstroms. The result is that the impurities placed in the surface layer by the predeposit are prevented from evaporating from the crystal during diffusion. Phosphorous impurities tend to "snowplow" with this treatment and the ultimate impurity level can be closely controlled in terms of the predeposit impurity concentration.

In fabricating hyperabrupt varactor diodes of this kind, the advantages of this invention are consistently obtained if the following general prescription is used.

The initial silicon bulk resistivity is characteristically high, of the order of $10^{13}$ to $10^{16}$ atoms cm.$^{-3}$. The predeposit, by ion bombardment is made into the surface region of the silicon to an average depth of less than 0.15 micron. For phosphorus ions a 0.15$\mu$ penetration requires an ion energy of the order of 150 kev. Low predeposit energies (e.g., 10 to 50 kev) result in less crystal damage in the bulk of the crystal. Ion doses in the range of $10^{10}$ to $10^{13}$ ions cm.$^{-2}$ give concentration appropriate for good junction characteristics. Phosphorus is the preferred dopant for *n*-type material. The diffusion should be carried on at a temperature in excess of 950° C. At temperatures below this, diffusion is very slow. The diffusion time should be selected, according to the temperature used, to effect a migration of impurity ions to an ultimate depth in the range of 0.2 to 3 microns. The oxygen ambient described above is helpful in forming an initial passivating layer as well as for avoiding evaporation of impurities. A thicker oxide layer can be deposited over the thermally grown layer for the final passivation. Silicon nitride can also be used for the passivating layer according to known teachings.

The passivating layer is then etched to form a window and a platinum-silicide Schottky barrier contact is formed in the window by standard methods to produce the rectifying contact. For example, 100 A. of platinum are evaporated into the window and the silicon is heated to form a platinum-silicide surface layer. Other surface barrier contacts can be used as well.

Figure 4:
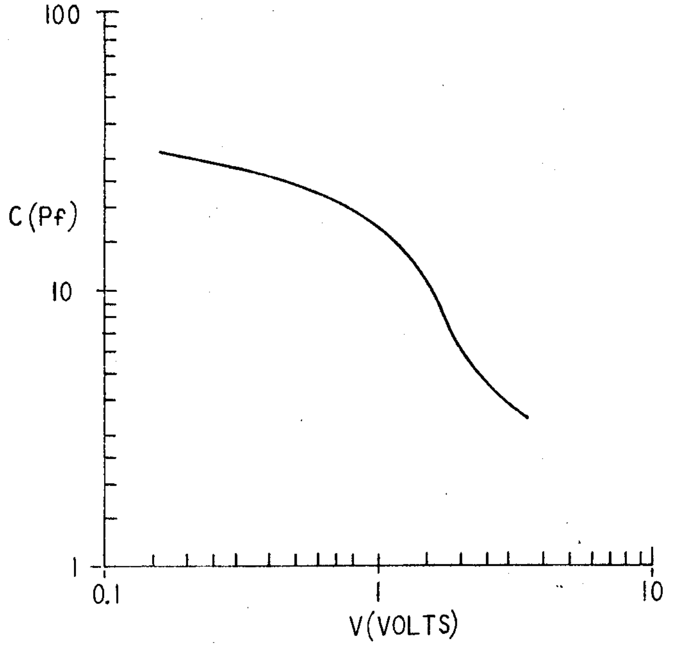
FIG. 4 is a specific C–V characteristic describing the electrical properties of a hyperabrupt diode fabricated in accordance with the teachings of the invention.

The electrical characteristics of a typical device produced according to the technique of this invention are described by the voltage capacitance curve of FIG. 4. The sharp break in capacitance occurring between 1 and 3 volts suggests a diode of high quality. This result can be reliably duplicated thereby evidencing a high degree of control over the impurity concentration and profile. This gives rise to the sharp voltage dependence of the capacitance.

It will be recognized that this use of an ion beam impurity source is technically not ion implantation as that term describes the placing of the high-energy ion directly at its ultimate site within the semiconductor by ion bombardment. Accordingly, in the process of this invention the ion beam step in the sequence is termed "ion beam predeposition."

A significant consequence of this technique is that the high degree of control characteristic of ion implantation is obtained without the usually attendant crystal damage. The predeposition can be made with low-energy ions. These cause relatively little damage and that damage occurs only at the surface of the semiconductor. Thus when the process is used for forming junctions, the impurity region near the junction will have the crystal perfection of a thermally diffused region.

A further advantage of the hybrid technique is the elimination of the "tail" that occurs in ion implanted impurity profiles. This results in a more uniform, controllable, and in some cases, a sharper profile.

Various additional modifications and extensions of this invention will become apparent to those skilled in the art. All such variations and deviations which basically rely on the teachings through which this invention has advanced the art are properly considered within the spirit and scope of this invention.

We claim:

1. A method for producing a silicon hyperabrupt diode comprising the steps of:

predepositing an impurity region in a silicon body having a bulk resistivity of the order of $10^{13}$ to $10^{16}$ atoms cm.$^{-3}$ by exposing the surface of the silicon body to an ion beam containing phosphorus ions having energies in the range of 10 kev. to 150 kev., the exposure being in the range of $10^{10}$ to $10^{13}$ ions cm.$^{-2}$;

heating the silicon body to a temperature of at least 950° C. to diffuse the impurities to a depth of 0.2 to 3 microns from said surface thus forming a graded impurity region; and forming a nonohmic electrical contact to said region.

2. The method of claim 1 in which the semiconductor body is maintained in an oxygen ambient during the heating step.

3. The method of claim 1 in which the nonohmic contact is a Schottky barrier contact formed by depositing a layer of a silicide-forming metal on the region and heating the silicon body to a temperature sufficient to form a metal-silicide to silicon rectifying barrier.

4. The method of claim 1 in which the nonohmic contact comprises a metal silicide.

5. The hyperabrupt varactor diode produced in accordance with the method of claim 1.

* * * * *